(12) United States Patent
Okabe

(10) Patent No.: US 8,851,106 B2
(45) Date of Patent: Oct. 7, 2014

(54) GAS SUPPLYING APPARATUS, CYLINDER CABINET PROVIDED WITH THE SAME, VALVE BOX, AND SUBSTRATE PROCESS APPARATUS

(75) Inventor: Tsuneyuki Okabe, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 315 days.

(21) Appl. No.: 13/409,327

(22) Filed: Mar. 1, 2012

(65) Prior Publication Data

US 2012/0222751 A1 Sep. 6, 2012

(30) Foreign Application Priority Data

Mar. 3, 2011 (JP) ................. 2011-046490

(51) Int. Cl.
*F16K 31/00* (2006.01)
*H01L 21/67* (2006.01)
*C23C 16/455* (2006.01)

(52) U.S. Cl.
CPC .... *H01L 21/67253* (2013.01); *H01L 21/67017* (2013.01); *C23C 16/45561* (2013.01); *Y02E 60/321* (2013.01); *Y02E 60/34* (2013.01); *C23C 16/45557* (2013.01)
USPC ........ 137/487.5; 137/487; 137/488; 137/377; 137/115.11; 156/345.15; 156/345.24; 156/345.26; 118/715

(58) Field of Classification Search
USPC ................. 137/487.5, 487, 488, 115.11, 377; 156/345.26, 345.24, 345.15; 340/605; 118/715
See application file for complete search history.

(56) References Cited

U.S. PATENT DOCUMENTS

| 6,176,930 | B1 * | 1/2001 | Koai et al. ...................... 118/715 |
| 6,253,783 | B1 * | 7/2001 | Carlsen et al. .................. 137/14 |
| 6,581,623 | B1 * | 6/2003 | Carpenter et al. ............ 137/113 |
| 6,857,447 | B2 * | 2/2005 | Olander et al. ............... 137/240 |
| 7,328,716 | B2 * | 2/2008 | Olander et al. .................... 137/2 |
| 7,614,421 | B2 * | 11/2009 | Olander et al. ............ 137/487.5 |
| 7,798,168 | B2 * | 9/2010 | Olander et al. ............ 137/487.5 |
| 7,896,967 | B2 * | 3/2011 | Hayasaka et al. ............. 118/715 |
| 8,240,324 | B2 * | 8/2012 | Monkowski et al. ........... 137/12 |
| 2001/0002581 | A1 * | 6/2001 | Nishikawa et al. ........... 118/715 |
| 2005/0199342 | A1 * | 9/2005 | Shajii et al. ............... 156/345.26 |
| 2007/0107783 | A1 * | 5/2007 | Lull et al. .................... 137/487.5 |
| 2007/0275560 | A1 * | 11/2007 | Nishimura et al. ........... 438/694 |
| 2010/0059694 | A1 * | 3/2010 | Olander et al. ............. 250/492.3 |

FOREIGN PATENT DOCUMENTS

| JP | 07-050418 | 5/1995 |
| JP | 2006-061824 | 3/2006 |

* cited by examiner

*Primary Examiner* — Eric Keasel
*Assistant Examiner* — Minh Le
(74) *Attorney, Agent, or Firm* — IPUSA, PLLC

(57) ABSTRACT

A disclosed gas supplying apparatus includes a pressure controller that reduces a primary pressure thereby providing a secondary pressure greater than a process pressure at which a predetermined process is performed and less than the atmospheric pressure in a secondary pipe; a pressure sensor that measures a pressure in the secondary pipe; a first open/close valve provided in the secondary pipe; an open/close valve controller that opens or closes the first open/close valve; a pressure comparator that compares the pressure measured by the pressure sensor in the secondary pipe with a first set pressure that is greater than the process pressure by a predetermined pressure; and a controller that outputs a signal to the open/close valve controller thereby closing the first open/close valve, when the pressure comparator determines that the pressure in the secondary pipe is less than the first set pressure.

10 Claims, 5 Drawing Sheets

GAS SUPPLYING APPARATUS, CYLINDER CABINET PROVIDED WITH THE SAME, VALVE BOX, AND SUBSTRATE PROCESS APPARATUS

CROSS-REFERENCE TO RELATED APPLICATION

The present application is based on Japanese Patent Application No. 2011-046490 filed with the Japanese Patent Office on Mar. 3, 2011, the entire contents of which are hereby incorporated herein by reference.

BACKGROUND OF THE INVENTION

1. Field of the Invention

The present invention relates to a gas supplying apparatus that is configured to supply gas to a chamber where a predetermined process is performed at a pressure lower than an atmospheric pressure. The present invention also relates to a cylinder cabinet, a valve box, and a substrate process apparatus that are provided with the gas supplying apparatus.

2. Description of the Related Art

There exist semiconductor fabrication apparatuses that utilize a process gas, such as a chemical deposition apparatus and an etching apparatus. Such semiconductor fabrication apparatuses are connected via a gas supplying pipe to a gas supplying source an example of which is a cylinder cabinet. Here, a pressure within the gas supplying pipe is maintained higher than an atmospheric pressure by 0.1 MPa in many cases. When the pressure within the gas supplying pipe is higher than the atmospheric pressure, there exists a slight possibility that a gas leakage may occur, for example, through joints provided in the gas supplying pipe. In order to address such a gas leakage, the joints may be collectively arranged within a container called, for example, a valve box that is connected to a predetermined evacuation apparatus. The valve box is constantly ventilated or evacuated by the evacuation apparatus, and monitored by a gas leakage detector. When a gas leakage is detected by the gas leakage detector, the valve box is urgently evacuated at a greater evacuation rate by the evacuation apparatus, thereby preventing the gas from leaking into a factory environment.

In addition, because there may be a possibility of gas leakage from a welded part of the gas supplying pipe, plural gas leakage detectors are arranged on a ceiling of the factory along the gas supplying pipe.

In addition, when a liquid source is used, the liquid source needs to be heated in order to increase a vapor pressure above the atmospheric pressure thereby to produce vapor or gas of the liquid source, which may lead to precipitation of the vapor or gas of the liquid source in the gas supplying pipe. When such precipitation occurs, the vapor or gas of the liquid source cannot be supplied at a desired flow rate, or the gas supplying pipe may be corroded by the precipitated source. Therefore, the gas supplying pipe needs to be heated by using a tape heater in order to avoid precipitation.

Patent Document 1: Japanese Patent Application Laid-Open Publication No. 2006-61824

Patent Document 2: Japanese examined patent publication No. H7-50418

SUMMARY OF THE INVENTION

When detecting or monitoring a gas leakage, evacuating the interior of the valve box constantly or forcibly, and heating the gas supplying pipe, requires additional electric power, which exceeds the usual amount of electric power required to run the semiconductor device fabrication apparatus. This in turn may increase production costs of the semiconductor devices. Therefore, achieving electric power savings has been desired.

The present invention has been made in view of the above, and provides a gas supplying apparatus, a cylinder cabinet provided with the gas supplying apparatus, a valve box, and a substrate process apparatus that are capable of reducing electric power required to operate factory utilities.

According to a first aspect of the present invention, there is provided a gas supplying apparatus that supplies a gas to a chamber where a process is carried out with respect to a substrate at a process pressure less than an atmospheric pressure. The gas supplying apparatus includes a pressure controller that reduces a primary pressure thereby providing a secondary pressure greater than the process pressure and less than the atmospheric pressure in a secondary pipe; a pressure sensor that measures a pressure in the secondary pipe; a first open/close valve provided in the secondary pipe; an open/close valve controller that opens or closes the first open/close valve; a pressure comparator that compares the pressure measured by the pressure sensor in the secondary pipe with a first set pressure that is greater than the process pressure by a predetermined pressure; and a controller that outputs a signal to the open/close valve controller thereby closing the first open/close valve, when the pressure comparator determines that the pressure in the secondary pipe is less than the first set pressure.

According to a second aspect of the present invention, there is provided a cylinder cabinet including a cabinet where the gas supplying apparatus of the first aspect is arranged; and at least a gas cylinder that is arranged in the cabinet and is connected to a primary pipe of the pressure controller.

According to a third aspect of the present invention, there is provided a valve box including a box where the gas supplying apparatus of the first aspect is arranged; one or more open/close valve(s) that are arranged in the box and are connected to a gas supplying line from a predetermined gas supplying source; and one or more pipe(s) that are connected to the corresponding one or more open/close valve(s) and to a predetermined substrate process apparatus.

According to a fourth aspect of the present invention, there is provided a substrate process apparatus including a cabinet where the gas supplying apparatus according to the first aspect is arranged; and a chamber to which a process gas is supplied from the gas supplying apparatus, wherein a predetermined process is performed at a pressure lower than an atmospheric pressure.

According to a fifth aspect of the present invention, there is provided a gas supplying method including steps of reducing a pressure of a process gas supplied from a process gas supplying source to a pressure that is greater than a process pressure at which a process is carried out with respect to a substrate and is less than an atmospheric pressure by using a pressure controller, thereby providing the process gas of which pressure is reduced to a secondary pipe at a secondary side of the pressure controller; monitoring the pressure of the process gas within the secondary pipe by using a pressure sensor provided in the secondary pipe; comparing the measured pressure of the process gas with a first set pressure that is greater than the process pressure by a predetermined value; and closing a first open/close valve provided in the secondary pipe when it is determined that the pressure within the secondary pipe is less than the first set pressure.

DETAILED DESCRIPTION OF THE PREFERRED EMBODIMENT

Figure 1:
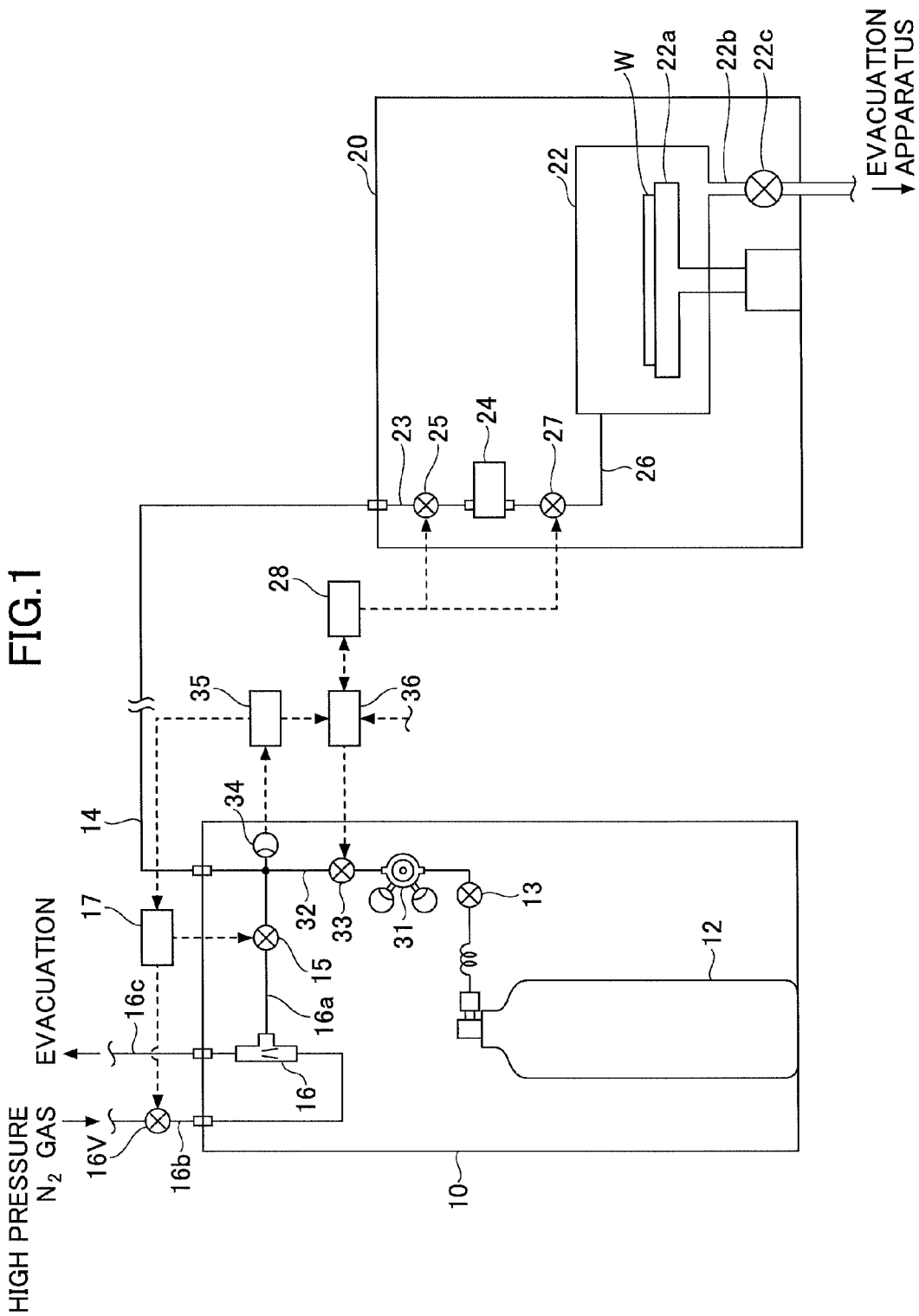
FIG. 1 is a schematic view of a cylinder cabinet provided with a gas supplying apparatus, according to a first embodiment of the present invention.

According to embodiments of the present invention, there are provided a gas supplying apparatus, a cylinder cabinet provided with the gas supplying apparatus, a valve box, and a substrate process apparatus that are capable of reducing electric power required to operate factory utilities.

Non-limiting, exemplary embodiments of the present invention will now be described with reference to the accompanying drawings. In the drawings, the same or corresponding reference symbols are given to the same or corresponding members or components.

First Embodiment

FIG. 1 is a schematic diagram of a cylinder cabinet including a gas supplying apparatus, and a substrate process apparatus to which a process gas is supplied from the cylinder cabinet, according to a first embodiment of the present invention. As shown in FIG. 1, a cylinder cabinet 10 is configured of a chassis that can be isolated from a surrounding environment, and houses a gas cylinder 12 filled with a process gas to be supplied to a chamber 22 of a substrate process apparatus 20. In addition, the gas cylinder 12 is connected to a primary side of a regulator 31 via a main valve 13. In this embodiment, the regulator 31 that can regulate a secondary pressure at negative pressures is used. In addition, the secondary pressure is adjusted by manipulating a handle provided in the regulator 31 in this embodiment. However, an electroneumatic regulator may be used as the regulator 31 in other embodiments.

A pipe 32 is connected to the secondary side of the regulator 31, and is provided with an open/close valve 33. The open/close valve 33 is an air-operation valve, and an air pipe (not shown) is connected to the open/close valve 33 via an electromagnetic valve (not shown). By electrically controlling the electromagnetic valve to open or close using a valve controller 36, the open/close valve 33 is controlled to open or close. Incidentally, the open/close valve 33 is preferably a normally-closed type air-operation.

In addition, a pressure sensor 34 is provided at a downstream side of the pipe 32 in relation to the open/close valve 33. In other words the pressure sensor 34 is positioned farther away from the open/close valve 33 with respect to the gas cylinder 12. The pressure sensor 34 measures a pressure in the pipe 32, or the secondary pressure of the regulator 31, and outputs a signal indicating the pressure to a pressure monitor 35. As the pressure sensor 34, a vacuum gauge such as a diaphragm vacuum gauge and a pirani vacuum gauge is used.

Moreover, the pipe 32 is connected at a ceiling plate of the cylinder cabinet 10 to a pipe 14, which in turn is connected to a pipe 23 inside the substrate process apparatus 20. Namely, the process gas filled in the gas cylinder 12 in the cylinder cabinet 10 is supplied to the substrate process apparatus 20 through the pipe 14.

The pipe 23 of the substrate process apparatus 20 is connected to a flow rate controller 24 such as a mass flow controller via an open/close valve 25. The flow rate controller 24 is connected to the chamber 22 by a main pipe 26 provided with an open/close valve 27. The chamber 22 includes an evacuation pipe 22b that is connected to an evacuation apparatus (not shown). In addition, the evacuation pipe 22b is provided with a main valve 22c. With the above configuration, the inside of the chamber 22 is controlled at a predetermined reduced pressure by the evacuation apparatus, and the process gas is supplied at a controlled flow rate to the chamber 22 by opening the open/close valves 25, 27. With this, a wafer W placed on a susceptor 22a inside the chamber 22 goes through a process (e.g., film deposition, etching or the like) depending on a type of the process gas.

Focusing attention on the cylinder cabinet 10 in FIG. 1, an ejector 16 is provided in the cylinder cabinet 10. The ejector 16 has an inlet, an outlet, and a high pressure gas inlet. A pipe 16a, which is provided with an open/close valve 15, is connected at one end to the inlet of the ejector 16 and at the other end to the pipe 32. A pipe 16b is connected at one end to the high pressure gas inlet of the ejector 16, and at the other end to a high pressure gas source (not shown) via an open/close valve 16V. A pipe 16c is connected at one end to the outlet of the ejector 16, and at the other end to a detoxifying apparatus (not shown). When the open/close valve 16V is opened and thus a high pressure gas is supplied to the high pressure gas inlet of the ejector 16, the high pressure gas flows at a relatively high speed toward the outlet of the ejector 16, which causes a reduced pressure on the inlet side of the ejector 16. Therefore, a gas within the pipe 16a is drawn into the ejector 16 and flows out from the outlet of the ejector 16 along with the high pressure gas.

In addition, the open/close valves 15, 16V are controlled to open or close by an ejector controller 17. When the open/close valves 15, 16V are opened by the ejector controller 17, the ejector 16 is activated so that the pipe 16a and thus the pipe 32 are evacuated. Moreover, the ejector controller 17 is electrically connected to a pressure monitor 35, and opens or closes the open/close valves 15, 16V in accordance with a signal from a pressure sensor 34 (described later).

The pressure monitor 35 inputs a signal from the pressure sensor 34 and compares the pressure within the pipe 32 based on the input signal with a predetermined first set pressure stored in advance. The first set pressure is preferably determined in accordance with a process pressure in the chamber 22 of the substrate process apparatus 20. Generally, a pressure difference between a gas inlet and a gas outlet of the flow rate controller 24 (a mass flow controller) is stipulated in specifications of the flow rate controller 24 in order to realize stable operation thereof. Here, when the pressure difference stipulated in the specification of the flow rate controller 24 is 100 Torr (13.3 kPa), the first set pressure stored in the pressure monitor 35 is preferably set to be greater than the process pressure by 100 Torr (13.3 kPa). On the other hand, because the secondary pressure of the regulator 31 is less than an atmospheric pressure (760 Torr (101.3 kPa)) in this embodiment, the first set pressure stored in the pressure monitor 35 is determined to be greater than "the process pressure+the pressure difference stipulated in the specifications of the flow rate controller 24" and less than 760 Torr (101.3 kPa). More specifically, the first set pressure is preferably determined to be greater than "the process pressure+the pressure difference stipulated in the specifications of the flow rate controller 24" by several tens of Torr, for example, 50 Torr (6.67 kPa) to 60 Torr (8.00 kPa).

After the pressure within the pipe 32 at the secondary side of the regulator 31 is compared with the first set pressure, when it is determined that the pressure within the pipe 32 is the first set pressure or less, the pressure monitor 35 outputs a signal that instructs the valve controller 36 to close the open/close valve 33. Upon receiving the signal, the valve controller 36 closes the open/close valve 33. With this, supplying the gas from the cylinder cabinet 10 is terminated. In addition, when it is determined by the pressure monitor 35 that the pressure within the pipe 32 falls below a pressure slightly greater than the first set pressure by about 10 Torr (1.33 kPa), even if the pressure within the pipe 32 does not reach the first set pressure, an alarm may be sent out or be displayed on a display panel (not shown) of the substrate process apparatus 20.

Incidentally, when the pressure monitor 35 outputs the signal to the valve controller 36, the pressure monitor 35 may output the similar signal to a controlling part (not shown) of the substrate process apparatus 20. With such a signal to the substrate process apparatus 20, an alarm may be displayed in the substrate process apparatus 20, and the substrate process apparatus 20 may be brought down to a standby state.

In addition, the valve controller 36 is connected to the controlling part of the substrate process apparatus 20. Moreover, the valve controller 36 can receive a predetermined signal through manual control of the display panel of the substrate process apparatus 20, thereby opening or closing the open/close valve 33.

Moreover, the valve controller 36 closes the open/close valve 33 in accordance with the signal from the pressure monitor 35 or the substrate process apparatus 20, and may output another signal to a valve controller 28 of the substrate process apparatus 20 at the same time. Upon receiving the signal, the valve controller 28 closes the open/close valve 27 and/or the open/close valve 25 arranged in the main pipe 26 of the chamber 22 of the substrate process apparatus 20. With this, a part of the pipes 14 and 23 between the open/close valves 33 and 27 are sealed.

Incidentally, when the part of the pipes 14 and 23 are sealed from the open/close valve 33 to the open/close valve 27, the valve controller 36 preferably informs the pressure monitor 35 that the part of the pipes 14 and 23 are sealed. With this, the pressure monitor 35 can monitor a pressure in the part of the pipes 14 and 23 sealed by the open/close valves 33 and 27, and calculate an increasing rate of the pressure. Because the open/close valves 33 and 27 are closed, if it is confirmed that the pressure is increased, leakage might take place in the part of the pipes 14 and 23. Therefore, the pressure monitor 35 determines whether the increasing rate of the pressure exceeds a predetermined value, and preferably outputs an alarm signal to the substrate process apparatus 20 when determined affirmatively. Upon receiving the alarm signal, the substrate process apparatus 20 displays a message indicating an abnormal increase in the pressure on the display panel (not shown), in order to inform an operator of the substrate process apparatus 20 of the abnormality. Then, the operator can carry out a leak testing in order to find a leakage point and fix the leakage.

Incidentally, when the substrate process apparatus 20 is in a standby state for a predetermined period of time, the pressure in the pipes 14 and 23 sealed by the open/close valves 33 and 27 may be preferably monitored and the increasing pressure rate may be preferably calculated. Alternatively, the pressure may be monitored through the display panel of the substrate process apparatus 20 by the operator of the substrate process apparatus 20. In addition, when the substrate process apparatus 20 is down to maintenance, the pressure in the pipes 14 and 23 sealed by the open/close valves 33 and 27 may be preferably monitored and the increasing pressure rate may be preferably calculated. Moreover, when the open/close valve 33 is closed, the pressure in the pipes 14 and 23 may start to be monitored, and when the open/close valve 33 is opened, the increasing pressure rate may be calculated. In this case, when it is determined that the increasing pressure rate exceeds a predetermined value, the open/close valve 33 is preferably kept closed.

In addition, the pressure monitor 35 can store a second set pressure that is greater than the first set pressure, and compare the pressure in the pipe 32 (or the secondary pressure of the regulator 31) that is measured by the pressure sensor 34 with the second set pressure. When it is determined that the pressure measured by the pressure sensor 34 is greater than the second set pressure, the pressure monitor 35 outputs a signal that starts the ejector 16, to the ejector controller 17. Upon receiving the signal, the ejector controller 17 opens the open/close valves 15 and 16V, thereby activating the ejector 16. In addition, even if the pressure measured by the pressure sensor 34 does not reach the second set pressure, when the pressure measured by the pressure sensor 34 exceeds a pressure that is slightly lower than the second set pressure, for example, by about 10 Torr, an alarm may sound, and the open/close valve 33 is preferably kept closed.

With the above configuration, when the process gas is supplied from the gas cylinder 12 to the regulator 31, a pressure of the process gas is reduced so that a pressure greater than the process pressure and less than the atmospheric pressure is obtained as the secondary pressure of the regulator 31, so that the process gas is supplied to the substrate process apparatus 20 at the pressure lower than the atmospheric pressure (or sub-atmospheric pressure). On the other hand, the pressure within the pipe 32 at the secondary side of the regulator 31 is measured by the pressure sensor 34, and the measured pressure is compared with the first set pressure by the pressure monitor 35. When the pressure within the pipe 32 is lower than the first set pressure, the open/close valve 33 of the pipe 32 is closed so that supplying of the process gas is terminated. In addition, the pressure within the pipe 32 is compared with the second set pressure by the pressure monitor 35. When the pressure within the pipe 32 is greater than the second set pressure, the ejector 16 is activated so that the pressure within the pipe 32 is reduced.

According to the first embodiment of the present invention, the pressure of the process gas in the gas cylinder 12 is reduced by the regulator 31 and a pressure that is less than the atmospheric pressure and greater than the process pressure is output at the secondary side of the regulator 31. The secondary pressure is measured by the pressure sensor 34 provided in the pipe 32, and compared with the first set pressure, which is set in advance, by the pressure monitor 35. When the measured pressure is lower than the first set pressure, the open/close valve 33 provided in the pipe 32 at the secondary side of the regulator 31 is closed by the valve controller 36. When the pressure within the pipe 32 becomes lower than the first set pressure, the flow rate controller 24 of the substrate process apparatus 20 does not stably control a flow rate of the process gas, which may lead to an inappropriate process of the substrate in the chamber 22 of the substrate process apparatus 20. However, according to the first embodiment of the present invention, when the pressure within the pipe 32 becomes lower than the first set pressure, because the open/ close valve 33 is closed thereby stopping supply of the process gas, an inappropriate process cannot be carried out.

In addition, while the pressure within the pipes 32, 14, and 23, or at the secondary side of the regulator 31 is maintained at less than atmospheric pressure, the process gas can be supplied at a stable flow rate to the chamber 22 of the substrate process apparatus 20. Moreover, because the pressure in the pipes 32, 14, and 23 is maintained at less than atmospheric pressure from the secondary side of the regulator 31 to the substrate process apparatus 20, it is not necessary to collectively arrange joints provided in the pipes 32, 14, and 23 within a valve box, and it is not necessary to monitor gas leakage using gas leakage detectors. Therefore, installation costs of the gas leakage detectors, electric power required to operate the gas leakage detectors, and maintenance costs of the gas leakage detectors can be reduced.

Moreover, because the process gas flows at a pressure less than atmospheric pressure from the secondary side of the regulator 31 inside the cylinder cabinet 10 to the evacuation pipe 22b of the substrate process apparatus 20, the process gas does not come out from the pipes 32, 14, and 23 to the outside environment. Therefore, there is no need to evacuate the substrate process apparatus 20. Accordingly, there is no need to install an evacuation apparatus that evacuates the interior of the substrate process apparatus 20, and electric power to operate such an evacuation apparatus is not necessary.

Even when a cylinder filled with a liquid source material is used as the gas cylinder 12 and the liquid source material within the cylinder is heated thereby supplying a vapor or gas of the liquid source material to the substrate process apparatus 20, a vapor pressure of the vaporized liquid source material merely needs to be greater than the process pressure and less than the atmospheric pressure. Therefore, precipitation or liquefaction of the liquid source material within the pipe 32 and the like can be suppressed, which means excessive heating of the pipe 32 and the like is not necessary. Accordingly, electric power required to heat the pipe 32 and the like can be reduced.

In addition, the cylinder cabinet 10 is provided with the ejector 16, so that the ejector 16 is activated when the pressure within the pipe 32 (the pipes 14, 23) is increased to be greater than the second set pressure. Therefore, the pressure within the pipe 32 is reduced. When the second set pressure is determined in advance to be, for example, 600 Torr (80.0 kPa) to 750 Torr (100 kPa), which are less than the atmospheric pressure, the pressure within the pipe 32 and thus the pipes 14 and 23 can be maintained less than the atmospheric pressure. Moreover, because the ejector 16 includes no moving parts, it is advantageous that maintenance of the ejector 16 is relatively easy.

Moreover, when the open/close valve 33 inside the cylinder cabinet 10 and the open/close valve 27 inside the substrate process apparatus 20 are closed, an increasing rate of the pressure within the pipes 32, 14, 23 between the open/close valves 33, 27 can be monitored, so that a gas leakage in the pipe 32 and the like can be detected. When the inside of the pipe 32 and the like is maintained at a pressure less than the atmospheric pressure and if a gas leakage takes place, air surrounding a gas leakage point is sucked into the pipes. In this case, the gas leakage sensor can not detect such a gas leakage, and moreover, the process gas within the pipes 32 and the like may be contaminated by the air, specifically, the process gas may be oxidized by oxygen contained in the air, so that defects are caused in the wafer W processed in the substrate process apparatus 20. However, with the above configurations, the gas leakage, which may take place in the pipes 32 and the like of which pressure is maintained at a pressure less than the atmospheric pressure, can be detected, so that contamination to the wafer W can be avoided.

Second Embodiment

Figure 2:
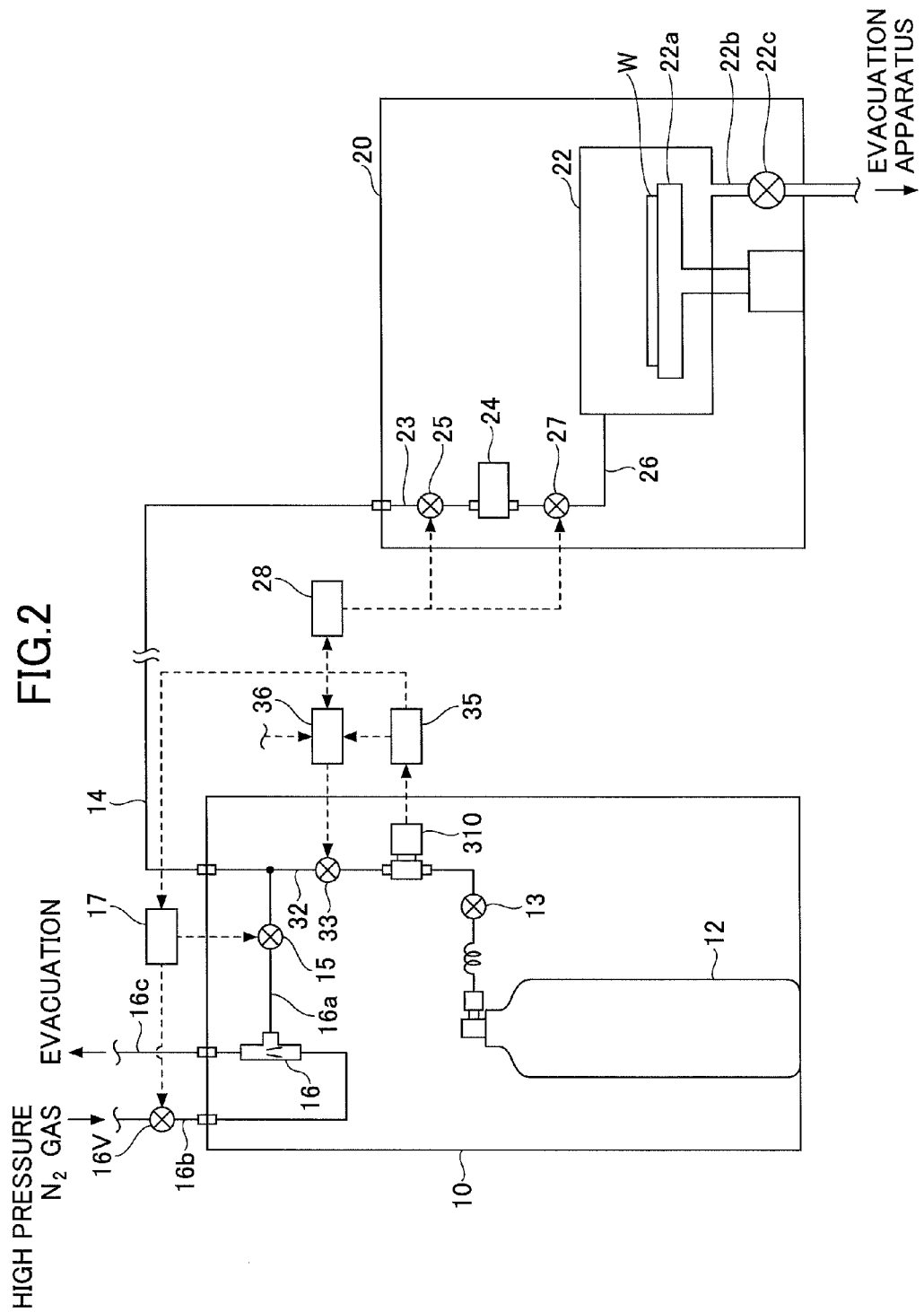
FIG. 2 is a schematic view of a cylinder cabinet provided with a gas supplying apparatus, according to a second embodiment of the present invention.

Next, a second embodiment of the present invention is explained with reference to FIG. 2. As shown in FIG. 2, an electroneumatic regulator 310 is used in the place of the regulator 31, in which the secondary pressure is manually set, in the first embodiment. The following explanation is mainly focused on such a difference.

An electroneumatic regulator 310 includes a pressure sensor (not shown) that measures the secondary pressure of the electroneumatic regulator 310, and an electromagnetic valve (not shown) that is controlled depending on a comparison result between a pressure measured by the pressure sensor and a set pressure value (See Patent Document 2, for example). With this configuration, the secondary pressure can be more stably maintained. In addition, the secondary pressure tends to be decreased in the case of the regulator 31, which may lead to an insufficient flow rate of the process gas in the first embodiment when a large amount of a process gas is supplied to the substrate process apparatus 20. However, because the secondary pressure can be controlled based on the secondary pressure measured by the pressure sensor built-in in the electroneumatic regulator 310, the pressure reduction at the secondary side of the electroneumatic regulator 310 can be suppressed, thereby realizing a desired flow rate of the process gas even when a large amount of the process gas needs to be supplied to the substrate process apparatus 20.

In addition, the pressure sensor 34 used in the first embodiment is not necessary in the second embodiment, and the pressure within the pipe 32 can be measured by the built-in sensor of the electroneumatic regulator 310. In other words, an electric signal indicating the pressure within the pipe 32, which is measured by the electroneumatic regulator 310, is output to the pressure monitor 35, and thus the secondary pressure based on the electric signal is compared with the first set pressure and the second set pressure in the pressure monitor 35.

Even with the use of the electroneumatic regulator 310, the pressure in the pipes 32, 14, and 23 or at the secondary pressure of the electroneumatic regulator 310 can be maintained greater than the process pressure and less than the atmospheric pressure, and the process gas can be stably supplied to the chamber 22 of the substrate process apparatus 20. Therefore, it is possible to save the installation, operational, and maintenance costs of the gas leakage detectors, the evacuation apparatus that evacuates the inside environment of the substrate process apparatus 20, a heating member that heats the pipe 32 and the like, and the gas leakage detectors for the pipe 32 and the like. In addition, by the use of the electroneumatic regulator 310 in the second embodiment, the secondary pressure can be further stabilized and a large amount of the process gas can be supplied to the substrate process apparatus 20.

Incidentally, the pressure sensor 34 may be used even in the second embodiment, in order to measure the pressure within the pipe 32. In this case, the pressure measured by the pressure sensor 34 is compared by the first set pressure and the second set pressure by the pressure monitor 35. In addition, the use of the pressure sensor 34 makes it easier to monitor an increase of the pressure within the pipes 32, 14, and 23 and to calculate the increasing pressure rate after the open/close valve 33 in the cylinder cabinet 10 and the open/close valve 27 in the substrate process apparatus 20 are closed. When the increasing pressure rate exceeds a predetermined rate, a potential gas leakage in the pipe 32 and the like can be recognized.

Third Embodiment

Figure 3:
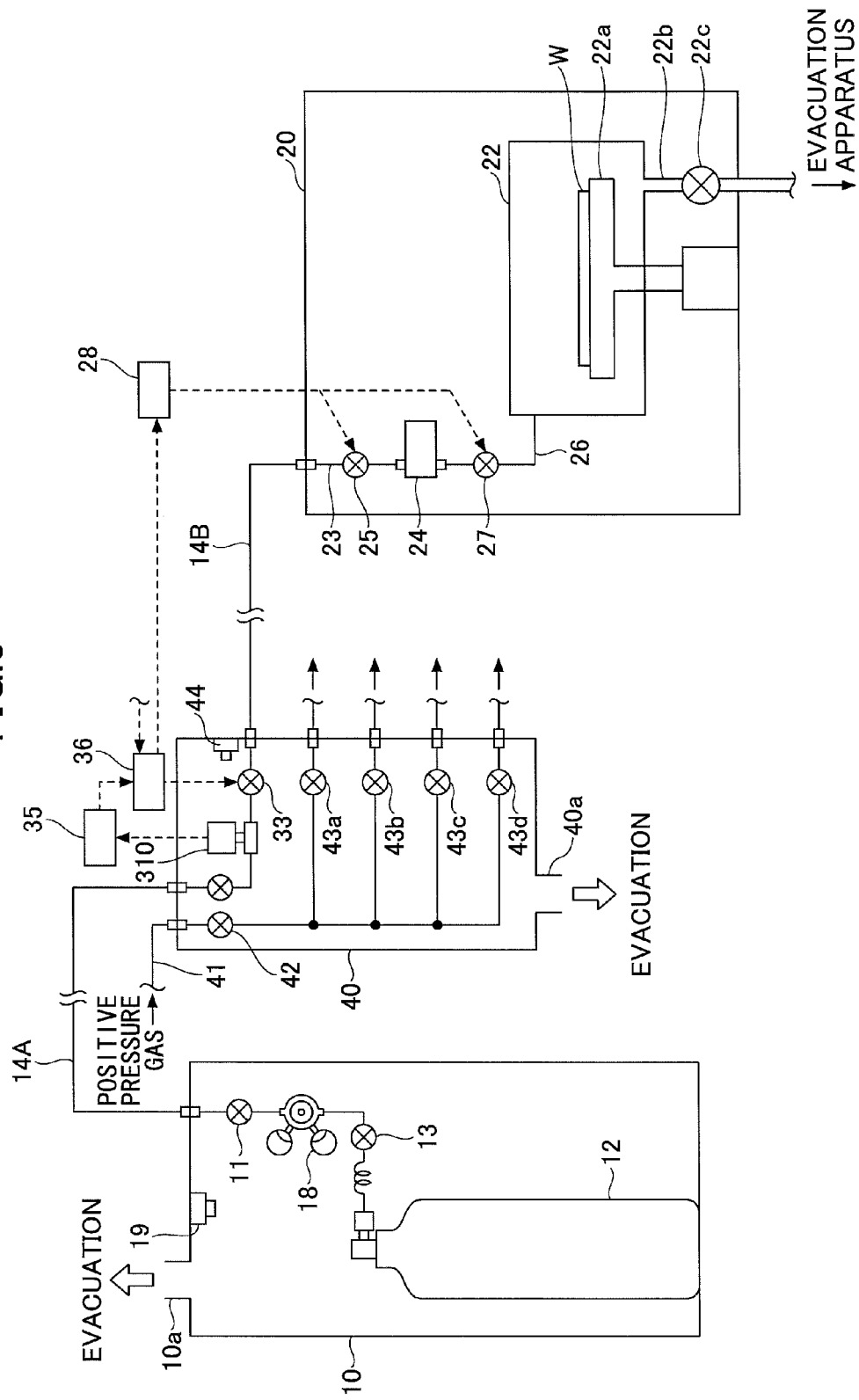
FIG. 3 is a schematic view of a valve box provided with a gas supplying apparatus, according to a third embodiment of the present invention.

Next, a third embodiment of the present invention is explained with reference to FIG. 3. As shown in FIG. 3, a valve box 40 is provided in the cylinder cabinet 10 and the substrate process apparatus 20 in the third embodiment. The valve box 40 is composed of a chassis that can be isolated from an outer environment. Specifically, the valve box 40 is connected to the cylinder cabinet 10 via a pipe 14A and to the substrate process apparatus 20 via a pipe 14B.

In the valve box 40, the electroneumatic regulator 310 and the open/close valve 33 are provided in a pipe that connects the pipe 14A to the pipe 14B. The electroneumatic regulator 310 reduces a pressure of the process gas within the pipe 14A, and produces a secondary pressure that is greater than the process pressure in the chamber 22 of the substrate process apparatus 20 and less than the atmospheric pressure. With this, the process gas flows at the pressure greater than the process pressure in the chamber 22 and less than the atmospheric pressure through the pipe 14B to the chamber 22. In addition, an electric signal indicating the pressure measured by the pressure sensor of the electroneumatic regulator 310 is input to the pressure monitor 35, and thus the measured pressure is compared with the first set pressure and the second set pressure by the pressure monitor 35.

Moreover, another pipe 41 is connected to and in the valve box 40. The pipe 41 is connected at one end to another gas cylinder (not shown) in the cylinder cabinet 10, or another cylinder cabinet (not shown), or a gas supplying source such as a clean room facility so that a process gas is supplied to the valve box 40 at a positive pressure. In addition, the pipe 41 is branched into plural branch pipes that are provided with corresponding open/close valves 43a to 43d. In addition, the branch pipes are connected to corresponding substrate process apparatuses. Incidentally, when the pipe 41 may be connected to a nitrogen gas source as a clean room facility, at least one of the branch pipes is connected to the substrate process apparatus 20 and the nitrogen gas is used as a purge gas for purging the chamber 22 with the nitrogen gas.

On the other hand, the gas cylinder 12 in the cylinder cabinet 10 is filled with a high pressure process gas, and the pressure of the process gas is reduced to, for example, a pressure that is greater than the atmospheric pressure by, for example, 0.1 MPa by a regulator 18. The process gas is supplied at the pressure (secondary pressure) to the pipe 14A at the downstream side of the regulator 18, and further to the valve box 40 when an open/close valve 11 is opened.

In this embodiment, the positive pressure process gas flows through the pipe 14A in the cylinder cabinet 10 and the pipe 41 in the valve box 40. Therefore, a gas leakage detector 19 is arranged inside the cylinder cabinet 10, so that a gas leakage inside the cylinder cabinet 10 is monitored. In addition, an evacuation port 10a is formed in the cylinder cabinet 10. The evacuation port 10a is connected to an evacuation apparatus (not shown), so that the inner environment of the cylinder cabinet 10 is always ventilated or evacuated at a pressure slightly less than the atmospheric pressure by the evacuation apparatus. In the similar manner, a gas leakage detector 44 is arranged inside the valve box 40, so that a gas leakage inside the valve box 40 is monitored. In addition, an evacuation port 40a is formed in the valve box 40. The evacuation port 40a is connected to an evacuation apparatus (not shown), so that the inner environment of the valve box 40 is always evacuated by the evacuation apparatus.

Nevertheless, the process gas does not flow at a positive pressure through the pipe 14B that connects the valve box 40 and the substrate process apparatus 20, because the pressure of the process gas is reduced by the electroneumatic regulator 310 in the valve box 40. In addition, the process gas does not flow at a positive pressure in the substrate process apparatus 20. Therefore, there is no need for providing gas leakage detectors along the pipe 14B and in the substrate process apparatus 20, and there is no need for evacuating the substrate process apparatus 20. Accordingly, also in this embodiment, the installation, operational, and maintenance costs of the gas leakage detectors, the evacuation apparatus that evacuates the substrate process apparatus 20, and the pipe heating member can be reduced.

Incidentally, a pressure sensor may be provided in the pipe 14B between the open/close valve 33 in the valve box 40 and the open/close valve 27 in the substrate process apparatus 20, even in this embodiment. With this pressure sensor, the pressure within the pipe 14B can be monitored when the open/close valve 33 and the open/close valve 27 are closed, and thus the increasing pressure rate of the pressure may be calculated by the pressure monitor 35. When the increasing pressure rate exceeds a predetermined value, a gas leakage can be recognized in the pipe 14B.

Incidentally, the valve box 40 may be provided with plural of the pipes 14B and plural branch pipes that are branched from the pipe 14A in the valve box 40 and connected to the corresponding pipes 146. With this configuration, the process gas can be supplied to plural of the substrate process apparatus 20, using only one pipe 14A from the cylinder cabinet 10. In this case, it is preferable that the branch pipes which are connected to the substrate process apparatuses 20 where a process is carried out at a pressure less than the atmospheric pressure are provided with the corresponding electroneumatic regulators 310 and the corresponding open/close valves 33 in the valve box 40. On the other hand, it is preferable that the branch pipes which are connected to the substrate process apparatuses 20 where a process is carried out at the atmospheric pressure (or a normal pressure) are provided only with the corresponding open/close valves without the regulators.

Fourth Embodiment

Figure 4:
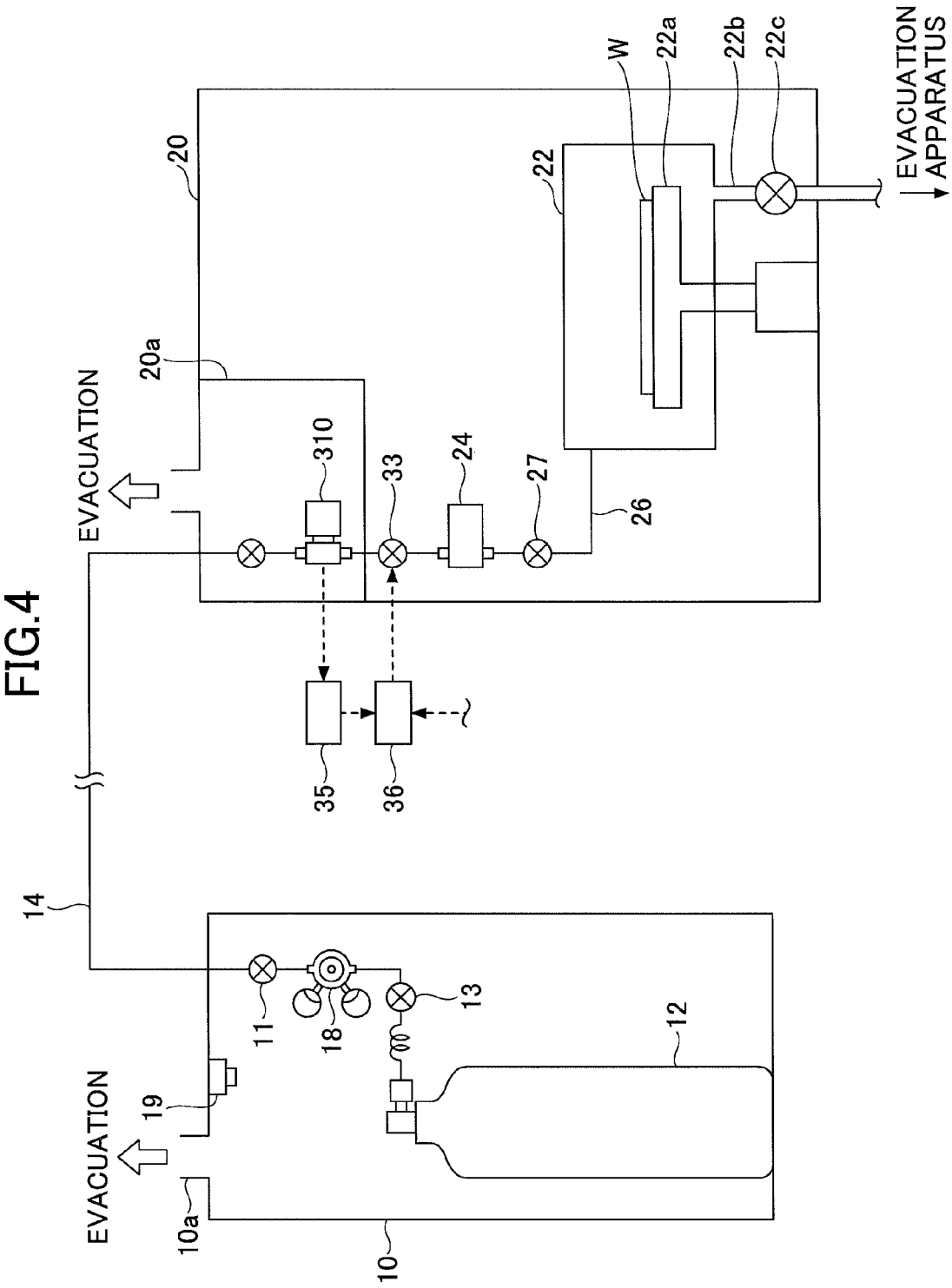
FIG. 4 is a substrate process apparatus provided with a gas supplying apparatus, according to a fourth embodiment of the present invention.

Next, a fourth embodiment of the present invention is explained with reference to FIG. 4. As shown in FIG. 4, the electroneumatic regulator 310 is provided inside the substrate process apparatus 20 in this embodiment. With the electroneumatic regulator 310, a positive pressure of a process gas that is supplied from the cylinder cabinet 10 to the substrate process apparatus 20 through the pipe 14 is reduced by the electroneumatic regulator 310, so that the process gas is provided at a secondary pressure greater than the process pressure within the chamber 22 and less than the atmospheric pressure.

In this case, the process gas flows at a positive pressure within the pipe 23 only at the primary side of the electroneumatic regulator 310 inside the substrate process apparatus 20. Therefore, a partition wall 20a is preferably provided in order to surround the electroneumatic regulator 310. In addition, it is preferable that the inside of the partition wall 20a is evacuated by an evacuation apparatus (not shown) and is monitored by a gas leakage detector (not shown). In this case, because the inside of the partition wall 20a is only locally evacuated, the installation and operational costs of the evacuation apparatus can be reduced compared where the inside of the substrate process apparatus 20 is entirely evacuated.

Modified Example

Figure 5:
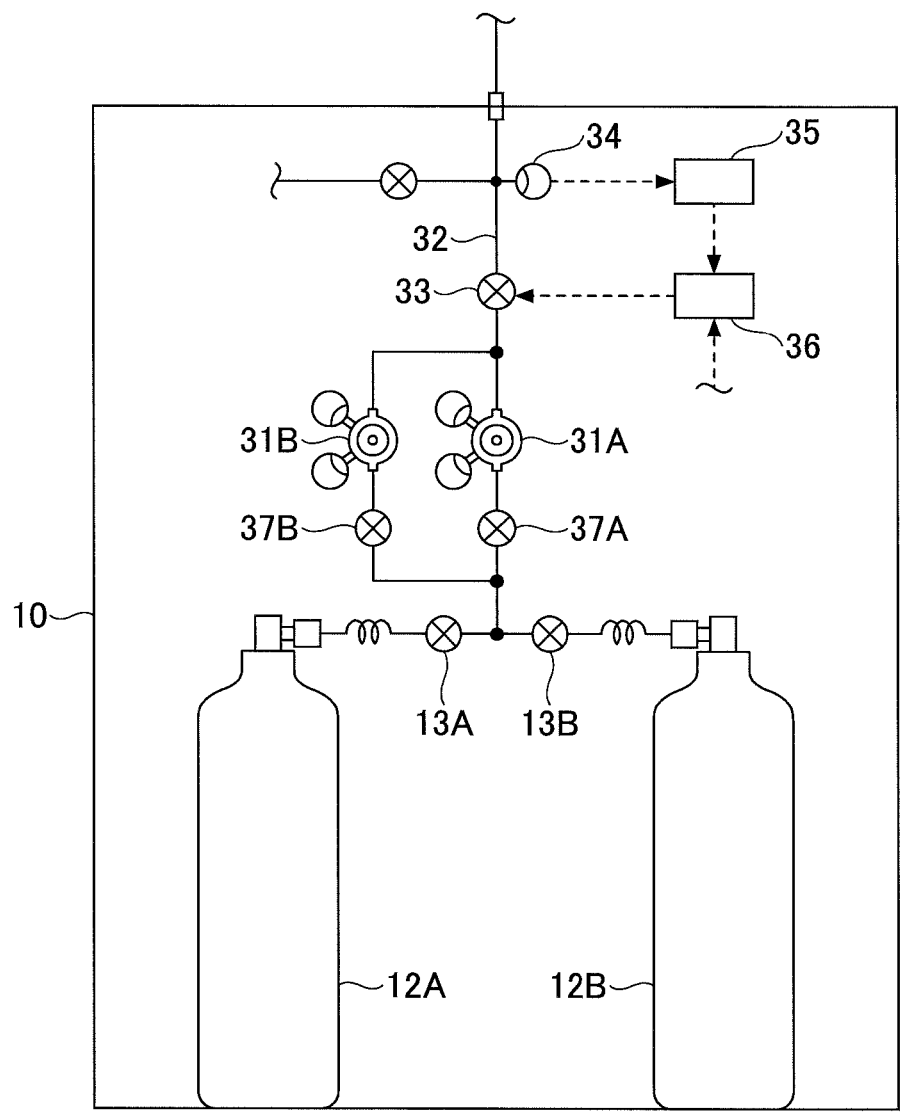
FIG. 5 is a modified example of the cylinder cabinet of FIG. 2.

A modified example of the cylinder cabinet 10 shown in FIG. 1 is explained with reference to FIG. 5. As shown in FIG. 5, gas cylinders 12A, 12B are provided in the cylinder cabinet 10 of this modified example. The gas cylinders 12A, 12B are filled with the same process gas.

In addition, two regulators 31A, 31B are arranged in parallel in the cylinder cabinet 10 of this modified example. Specifically, the regulators 31A, 31B are connected to the gas cylinders 12A, 12B via open/close valves 13A, and 13B, respectively. An open/close valve 37A is provided between the regulator 31A and the open/close valves 13A, 13B, and an open/close valve 37B is provided between the regulator 31B and the open/close valves 13A, 13B.

With such a configuration, the gas cylinders 12A, 12B can be switchably used. Namely, when the gas cylinder 12A is first used, slightly before the gas cylinder 12A becomes empty, the open/close valve 13A is closed and the open/close valve 13B is opened, the gas cylinder 12B can be started in use. Then, while the gas cylinder 12B is used, the gas cylinder 12A can be replaced with a new gas cylinder, so that the process gas can continue to be supplied from the cylinder cabinet 10 without any interruption.

Moreover, when the open/close valves 37A, 37B are selectively opened, the regulators 31A, 31B are selectively used. For example, when the regulator 31A malfunctions, the open/close valve 37A is closed and then the open/close valve 37B is opened in order to use the regulator 31B, thereby reducing an interruption of supplying the process gas from the cylinder cabinet 10. Furthermore, when the open/close valves 37A, 37B are opened, the process gas can be supplied at a relatively large flow rate.

In addition, other configurations of the cylinder cabinet 10 of this modified example are substantially the same as those of the cylinder cabinet 10 according to the first embodiment. Therefore, the same effects or advantages as those of the cylinder cabinet 10 of the first embodiment are provided by the cylinder cabinet 10 of this modified example.

Next, an electric power saving effect, which can be provided according to an embodiment of the present invention, is explained. Assuming that one of a cylinder cabinet, a valve box, and a substrate process apparatus is evacuated at a rate of 3 $m^3$ per minute and an electric power required to evacuate air at a rate of 1 $m^3$ per minute, electric power of 0.067 kW is consumed per minute, and thus electric power of 5,834 kW is consumed per year. Therefore, if the need for evacuating one of the cylinder cabinet, the valve box, and the substrate process apparatus is eliminated, such electric power can be saved. If the amount of the electric power saved is converted to an amount of $CO_2$, which is one of the greenhouse effect gases, $CO_2$ emission of 2.3 tons can be reduced, thereby reducing the environmental load. In addition, assuming that a tape heater is used to heat pipes under conditions that electric power of 0.315 kW is consumed when the electric power is supplied to the tape heater in 70% of an hour, electric power of 0.305 is consumed when the tape heater is in a standby state in 25% of an hour, and no electric power is consumed when the tape heater is not used in 5% of an hour, an electric power consumption amounts to 0.296 kWh for heating 7.4 m of the pipe, and thus equates to approximately 2595 kWh per year. Such electric power consumption amounts to a $CO_2$ emission of 1.04 tons. With these calculations, the effects or advantages of the embodiments can be understood. Especially, when the need for evacuating the cylinder cabinets, the valve boxes, and the substrate process apparatuses in an entire clean room and the need for heating the pipes in the entire clean room are eliminated, the reduced electric power consumption and thus the reduced emission of $CO_2$ can significantly alleviate the environmental load.

While the present invention has been described with reference to the foregoing embodiments, the present invention is not limited to the disclosed embodiments, but may be modified or altered within the scope of the accompanying claims.

For example, when the gas cylinder 12 inside the cabinet box 10 is filled with a high pressure gas, the cabinet box 10 is preferably provided with an evacuation port and an evacuation pipe through which the inner environment of the cabinet box 10 is evacuated, and a leakage sensor that can monitor gas leakage inside the cabinet box 10. On the other hand, when only a cylinder that is filled with a liquid source material is arranged in the cabinet box 10, the evacuation port and the evacuation pipe are not necessary because there is not a gas whose pressure is greater than the atmospheric pressure. In addition, when a high pressure gas cylinder and a liquid source material cylinder are arranged in the cabinet box 10, the high pressure gas cylinder may be enclosed by a predetermined partition wall, and the enclosed space may be evacuated by a predetermined evacuation apparatus. With this configuration, there is no need for evacuating the entire space inside the cabinet box 10, thereby saving electric power required for evacuation.

In addition, the regulator 31 may be used in the valve box 40 according to the third embodiment, and also the pressure sensor 34 may be used in the valve box 40. Moreover, the regulator 31 and the pressure sensor 34 may be used in the substrate process apparatus 20 according to the fourth embodiment. Furthermore, the electroneumatic regulator 310 may be used in the modified example of the cylinder cabinet 10 shown in FIG. 5.

In addition, the ejector 16 explained in the first and the second embodiments may be used in the third and the fourth embodiments.

In the forgoing embodiments, when the increasing rate of the pressure of the process gas within the pipe 32 and the like is monitored and calculated, the open/close valve 13 provided between the regulator 31 (or the electroneumatic regulator 310) and the gas cylinder 12 may be closed instead of the open/close valve 33. In this case, the pipe between the regulator 31 (or the electroneumatic regulator 310) and the open/close valve 13 is evacuated by using the ejector 16 or the evacuation apparatus of the substrate process apparatus 20 where a process is carried out at a pressure less than the atmospheric pressure (or a sub-atmospheric pressure), and then a pressure within the pipe 14 and the like may be monitored.

While the regulators 31A, 31B are arranged in parallel in the cabinet box 10 of FIG. 5, the valve box 40 of FIG. 3 and/or the substrate process apparatus 40 of FIG. 4 may be provided with two regulators (or electroneumatic regulators) in parallel.

The process gas may be, for example, a source gas used in a chemical vapor deposition (CVD) apparatus, an etching gas used in an etching apparatus, an inert gas such as nitrogen gas and noble gases, and hydrogen gas.

What is claimed is:
1. A gas supplying apparatus that supplies a gas to a chamber where a process is carried out with respect to a substrate at a process pressure less than an atmospheric pressure, the gas supplying apparatus comprising:

a pressure controller that reduces a primary pressure thereby providing a secondary pressure greater than the process pressure and less than the atmospheric pressure in a secondary pipe;

a pressure sensor that measures a pressure in the secondary pipe;

a first open/close valve provided in the secondary pipe;

an open/close valve controller that opens or closes the first open/close valve;

a pressure comparator that compares the pressure measured by the pressure sensor in the secondary pipe with a first set pressure that is greater than the process pressure by a predetermined pressure;

a controller that outputs a signal to the open/close valve controller thereby closing the first open/close valve, when the pressure comparator determines that the pressure in the secondary pipe is less than the first set pressure; and a flow rate controller connected to the secondary pipe;

wherein the first set pressure is greater than the sum of the process pressure and a pressure difference stipulated in a specification of the flow rate controller; and wherein the first set pressure is less than atmospheric pressure.

2. The gas supplying apparatus of claim 1, further comprising:

a second open/close valve provided at a downstream side of the secondary pipe with respect to the first open/close valve and the pressure sensor; and an alarm signal generation part that generates an alarm signal when the pressure measured by the pressure sensor is increased at a greater rate than a predetermined rate after the first open/close valve and the second open/close valve are closed.

3. The gas supplying apparatus of claim 1, further comprising a gas ejector that is connected to the secondary pipe via an open/close valve, wherein the gas ejector is activated when it is determined by the pressure comparator that the measured pressure in the secondary pipe is greater than a second set pressure that is greater than the first set pressure.

4. The gas supplying apparatus of claim 1, wherein the pressure controller comprises an electroneumatic regulator.

5. A cylinder cabinet comprising a cabinet where the gas supplying apparatus of claim 1 is arranged; and at least a gas cylinder that is arranged in the cabinet and is connected to a primary pipe of the pressure controller.

6. A valve box comprising a box where the gas supplying apparatus of claim 1 is arranged;

one or more open/close valve(s) that are arranged in the box and are connected to a gas supplying line from a predetermined gas supplying source; and one or more pipe(s) that are connected to the corresponding one or more open/close valve(s) and to a predetermined substrate process apparatus.

7. A substrate process apparatus comprising:

a cabinet where the gas supplying apparatus of claim 1 is arranged; and a chamber to which a process gas is supplied from the gas supplying apparatus, wherein a predetermined process is performed at a pressure lower than an atmospheric pressure.

8. A gas supplying method comprising the steps of:

reducing a pressure of a process gas supplied from a process gas supplying source to a pressure that is greater than a process pressure at which a process is carried out with respect to a substrate and is less than an atmospheric pressure by using a pressure controller, thereby providing the process gas of which pressure is reduced to a secondary pipe at a secondary side of the pressure controller;

monitoring the pressure of the process gas in the secondary pipe by using a pressure sensor provided in the secondary pipe;

comparing the measured pressure of the process gas with a first set pressure that is greater than the process pressure by a predetermined value; and closing a first open/close valve provided in the secondary pipe when it is determined that the pressure in the secondary pipe is less than the first set pressure;

wherein the first set pressure is greater than the sum of the process pressure and a pressure difference stipulated in a specification of a flow rate controller connected to the secondary pipe; and wherein the first set pressure is less than atmospheric pressure.

9. The gas supplying method of claim 8, further comprising steps of:

closing the first open/close valve and a second open/close valve, the second open/close valve being provided in the secondary pipe at a downstream side of the first open/close valve and the pressure sensor; and monitoring the pressure measured by the pressure sensor when the first open/close valve and the second open/close valve are closed; and emanating an alarm signal when the pressure monitored in the monitoring step is increased at a increasing pressure rate that is greater than a predetermined increasing rate.

10. The gas supplying method of claim 8, further comprising a step of ejecting a gas ejector connect to the secondary pipe when the pressure measured in the secondary pipe is greater than a second set pressure that is greater than the first set pressure.

* * * * *